United States Patent [19]

Hieke

[11] 4,057,722
[45] Nov. 8, 1977

[54] METHOD AND APPARATUS FOR THE GENERATION OF DISTORTION-FREE IMAGES WITH ELECTRON MICROSCOPE

[75] Inventor: Eduard Hieke, Munich, Germany

[73] Assignee: Siemens Aktiengesellschaft, Berlin & Munich, Germany

[21] Appl. No.: 724,620

[22] Filed: Sept. 20, 1976

[30] Foreign Application Priority Data

Sept. 25, 1975 Germany .............................. 2542812
Apr. 20, 1976 Germany .............................. 2617159

[51] Int. Cl.² ............................................ H01J 37/28
[52] U.S. Cl. ..................................... 250/311; 250/398
[58] Field of Search .......................... 250/311, 396, 398

[56] References Cited

U.S. PATENT DOCUMENTS 3,900,734  8/1975  Kynaston et al. ..................... 250/311

Primary Examiner—Alfred E. Smith
Assistant Examiner—T. N. Grigsby
Attorney, Agent, or Firm—Hill, Gross, Simpson, Van Santen, Steadman, Chiara & Simpson

[57] ABSTRACT

A specimen to be analyzed under an electron microscope is oriented at an inclined angle relative to a plane normal to the beam. The beam is deflected to form a scanning raster to scan the specimen, and the raster and specimen are each rotated independently about the axis of the beam, to produce an image of the inclined specimen in which orthogonal lines in the sample are represented by orthogonal lines in the image. A microprocessor is employed for rotating the scanning raster relative to the specimen in accordance with its angle of inclination, the effective focal length of the electron lens, the primary beam voltage of the electron beam, and the current flowing through the condenser lens.

10 Claims, 10 Drawing Figures

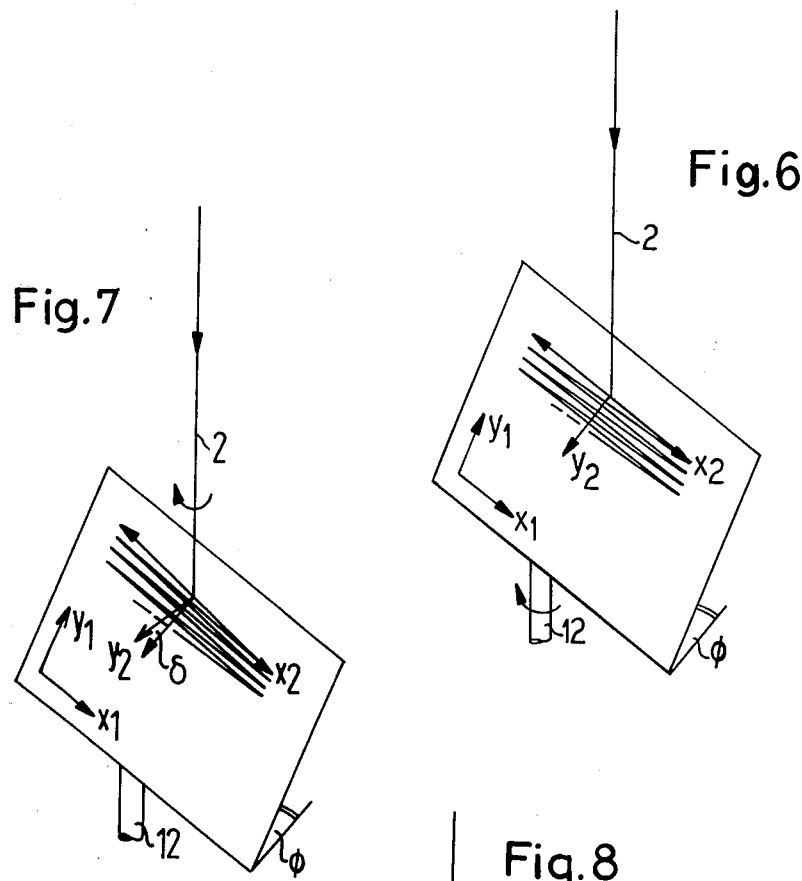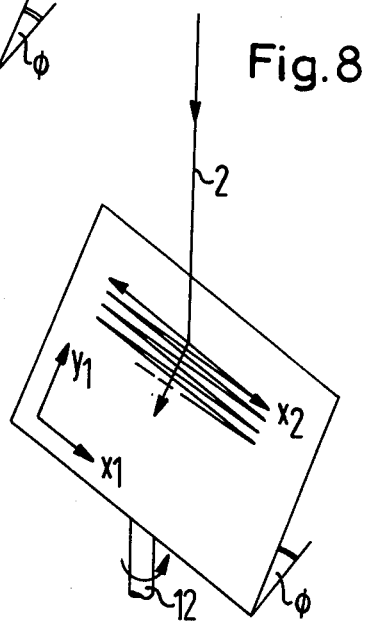

METHOD AND APPARATUS FOR THE GENERATION OF DISTORTION-FREE IMAGES WITH ELECTRON MICROSCOPE

BACKGROUND

Field of the Invention

The present invention relates to electron microscopes, and particularly to electron microscopes of the scanning beam variety, in which a specimen is scanned with a beam controlled so as to produce a scanning raster: Scanning Electron Microscope, abbrev. SEM.

The Prior Art

Electron microscopes of the scanning beam variety (SEM) are known, and are widely used to produce photographs or television style images of the specimens being examined. These devices work well when the surface of the specimen being examined is normal to the electron beam. It is difficult, however, to investigate the topographical characteristics of the surface of the specimen when the specimen is maintained in a position normal to the beam. When the specimen is inclined relative to a plane normal to the beam, however, the image produced by the electron microscope is distorted in that a rectangle on the surface of the specimen is depicted as a parallelogram. It has, therefore, been necessary to perform scaling and conversion procedures in order to investigate quantitatively the topological characteristics of the specimen, as described by T. Ricker and C. Schwing, in Solid-State Techn. (Oct. 1975, pp. 69, et seq.); E. K. Brandis in the 5th *IITRI-SEM Proceedings,* Chicago, 1972, (pp. 241-248); and by J. Liebidzik and E. W. White in the 8th *IITRI-SEM Proceedings,* Chicago, 1975 (pp. 181-188). All of these procedures one or more serious disadvantages, such as contamination of the clean environment within an electron microscope, or the use of complicated and expensive equipment.

U.S. Pat. No. 3,900,734 proposes compensating for raster rotation by modifying signals connected with the scanning coils of the electron microscope, but an attempt to use this technique in eliminating distortion in examining inclined specimens requires a separate procedure for each specimen.

The distortion is caused by rotation of the scanning raster about the axis of the beam, in a longitudinal magnetic field, as described in W. Glaser, *Grundlagen der Elektronenoptik,* Springer Press, Vienna, 1953. While methods of reducing or compensating for the amount of raster rotation are known and described in Reimer and Pfefferkorn, *Raster Elektronenmikroskopie,* Springer, Berlin, 1973, pp. 63 et seq., these methods are useful only for fixed working distances or are generally valid only for non-inclined specimens.

The interaction of the raster rotation and the inclination of the sample produces complicated distortions which make analysis of the specimen difficult.

BRIEF SUMMARY OF THE PRESENT INVENTION

It is a principal object of the present invention to provide a relatively simple apparatus and method for use with an electron microscope by which the distortion resulting from inclining a specimen relative to the plane normal to an electron beam is eliminated.

A further object of the present invention is to provide an apparatus and method by which distortion resulting from inclination of a specimen is eliminated automatically, without the need for any calculations by an operator.

Another object of the present invention is to provide such a system in which a microprocessor is employed for automatically controlling a parameter of the electron microscope electron lens system so that distortion resulting from inclination of a specimen is eliminated, as a function of independent variables corresponding to the effective focal length of the electron lens, the primary beam voltage, and the condenser lens current.

An advantage of the present invention is to allow the use of photographs produced from scanning electron microscopes for quantitative determinations of topographical features.

These and other objects and advantages of the invention will become manifest by an examination of the following description and the accompanying drawings.

In one embodiment of the present invention, there is provided an electron microscope having means for supporting a specimen in the path of an electron beam at an attitude inclined relative to a plane normal to the beam, and means for rotating the scanning raster of the electron beam in response to the angular orientation of the sample about the axis of the electron beam.

BRIEF DESCRIPTION OF THE DRAWINGS

Reference will now be made to the accompanying drawings in which

FIG. 6 is a perspective view similar to that of FIG. 5, in which the rotation of the scanning raster has been partially compensated for;

FIGS. 7 and 8 are two additional diagrammatic view of a specimen inclined at an angle relative to a plane normal to the beam, illustrating the effects of rotation of the scanning raster beam and rotation of the specimen, respectively:

DESCRIPTION OF THE PREFERRED EMBODIMENTS

Figure 1:
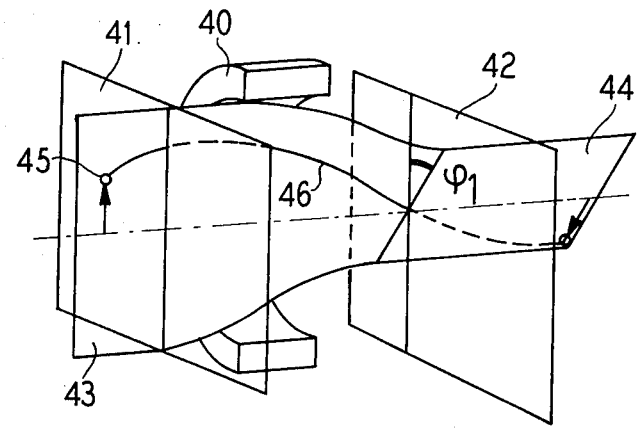
FIG. 1 is a diagrammatic illustration of the manner in which a scanning raster is rotated by means of the electron lens associated with an electron microscope (e.g. $\phi$)
Figure 2:
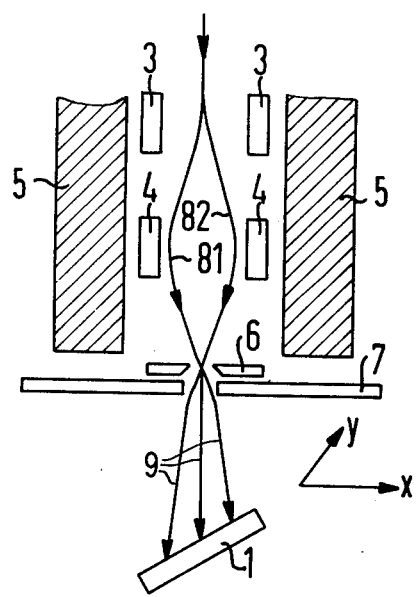
FIG. 2 is a diagrammatic illustration of a cross-section of the optical system of an electron microscope.

FIGS. 1 and 2 both illustrate phenomena which are already known. In FIG. 1, an electron lens 40 is illustrated diagrammatically and the orientation of a scanning raster is illustrated diagrammatically as it passes through the electron lens. Rectangles 41-44 are fixed planes used for reference on both sides of the lens. Planes 41 and 42 are normal to the beam axis and planes 43 and 44 are normal to the planes 41 and 42 each of which include the beam axis and are normal to the planes 41 and 42. An electron 45 moving in the plane 43 experiences a rotation as it reaches the plane 41, following a helical path 46 Rotation stops when the plane 42 is reached, after which the electron moves in plane 44. The angle of rotation $\phi_1$ is a function of the distance between planes 41 and 42.

FIG. 2 illustrates the components of the lens system of an electron microscope. An inclined sample 1 is illustrated, which is illuminated with a beam produced by an electron gun (not shown). Two deflection systems 3 and 4 are illustrated, for deflecting the beam to form a scanning raster, and a condenser 5 surrounds the entire deflection assembly. An aperture stop 6 is provided for defining the diameter of the beam, and a pole shoe 7 is provided with an aperture aligned with the aperture stop 6, for sealing the magnetic field produced by the lens assembly. The scanning beam is formed of electrons following a plurality of paths 81 and 82 within the deflection assembly, but becomes focused on the specimen 1, located at some distance away from the pole shoe 7. The scanning beam is moved to form a raster on the specimen, in order to scan an area of the surface of the specimen, and thus traverses a plurality of paths 9.

Figure 3:
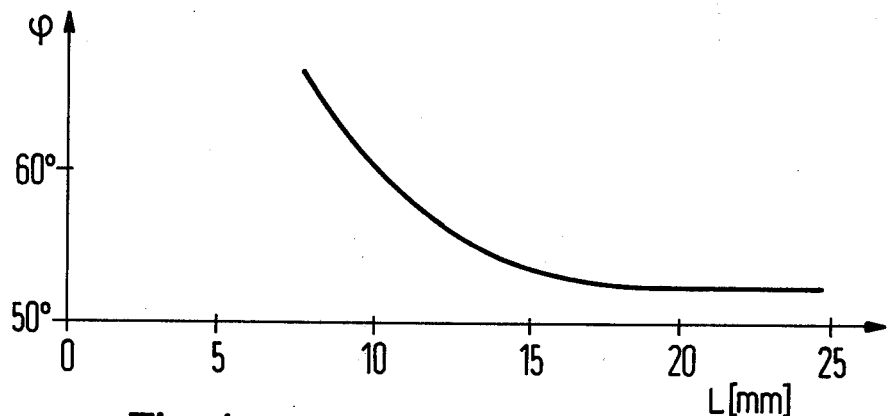
FIG. 3 is a graph of a relationship between the angle of rotation $\phi$ of a scanning raster about the beam axis, and the working distance L of the microscope.

FIG. 3 illustrates the dependency of the rotational angle $\phi$ on the working interval $d$, which expresses the distance of the specimen from the lens. The relationship illustrated by the graph of FIG. 3 closely approximates $\phi = 1/\sqrt{F}$ for a weak lens with a focal length F, in which $K^2 << 1$. (K is the usually defined "lens strength").

Figure 4:
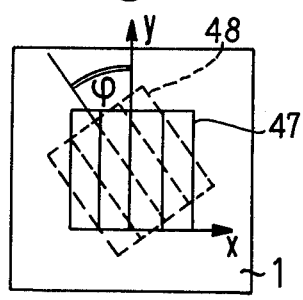
FIG. 4 is a plan view of a specimen illustrating the rotation of the scanning about the beam axis.

FIG. 4 the specimen 1 is shown in plan, and has a surface feature 47 which is to be reproduced on the picture screen of the microscope. For the sake of simplicity it is to be initially assumed that specimen 1 is not arranged in an inclined position, which means that the electron beam impacts perpendicularly onto the specimen 1. As a consequence of the rotation of the scanning beam, the picture which is displayed is also rotated so that the pattern 48 represented by the broken lines is reproduced on the screen.

Figure 5:
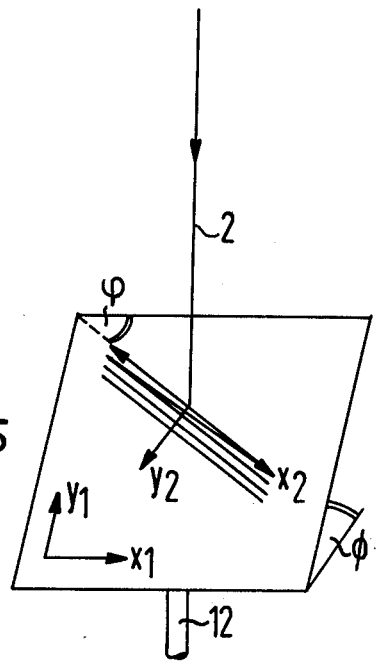
FIG. 5 is a perspective view of the sample inclined at an angle relative to a plane normal to the beam, illustrating principles involved in the image rotation.

When the specimen 1, as already explained above, is not arranged perpendicularly to the electron beam, but rather is inclined, the relationships are considerably more complicated. In FIG. 5 it is represented that an electron beam impacting on a specimen inclined by an angle $\phi$ often coincides neither in its $x_2$-direction, in which the deflection occurs, nor in its $y_2$-direction, which corresponds to the direction in which the scanning advances with the $x_1$ or the $y_1$ axes of the specimen, respectively.

By means of the present invention, the specimen 1, which is inclined by the angle $\phi$, is rotated about the beam axis 12 by rotating its supporting platform in such a way that the $x_2$-direction, in which the beam is deflected, coincides (FIG. 6) with the $x_1$-direction of the specimen. Then a coincidence of the $x_1$-direction with the $x_2$-direction results on the screen. The line of steepest gradient $y_1$ of the specimen does not yet coincide, however, with the scanning advance direction $y_2$. In order to achieve this coincidence, rotation is now electrically carried out in the same direction by means of a per se known electrical raster rotation device, around an angle value $\phi$ corresponding to the working distance L. In the process, by virtue of the inclination angle $\phi$, the apparent rotation of the $y_2$-direction in the image plane, is greater than the $x_2$ direction. As a result, not only the $x_2$-direction but also the $y_2$-direction are then rotated, vis-a-vis the $x_1$-direction or, respectively, the $y_1$-direction, by the same angle amount, so that this can then be compensated for by a mechanical back-rotation. A suitable raster rotation device is described in Reimer and Pfefferkorn's work, referred to above.

As represented in FIG. 7, and $x_2$-direction is rotated out of the $x_1$-direction during the rotation of the scanning raster by the angle $\phi e$.

In order to obtain the desired undistorted image, which is suitable for quantitative geometric measurements, rotation is mechanically carried out, as already indicated above, about the axis 12 in the opposite direction until the desired, raster-parallely aligned image is produced in the image plane. From such images produced by the present invention, topographical magnitudes can be determined.

Figure 9:
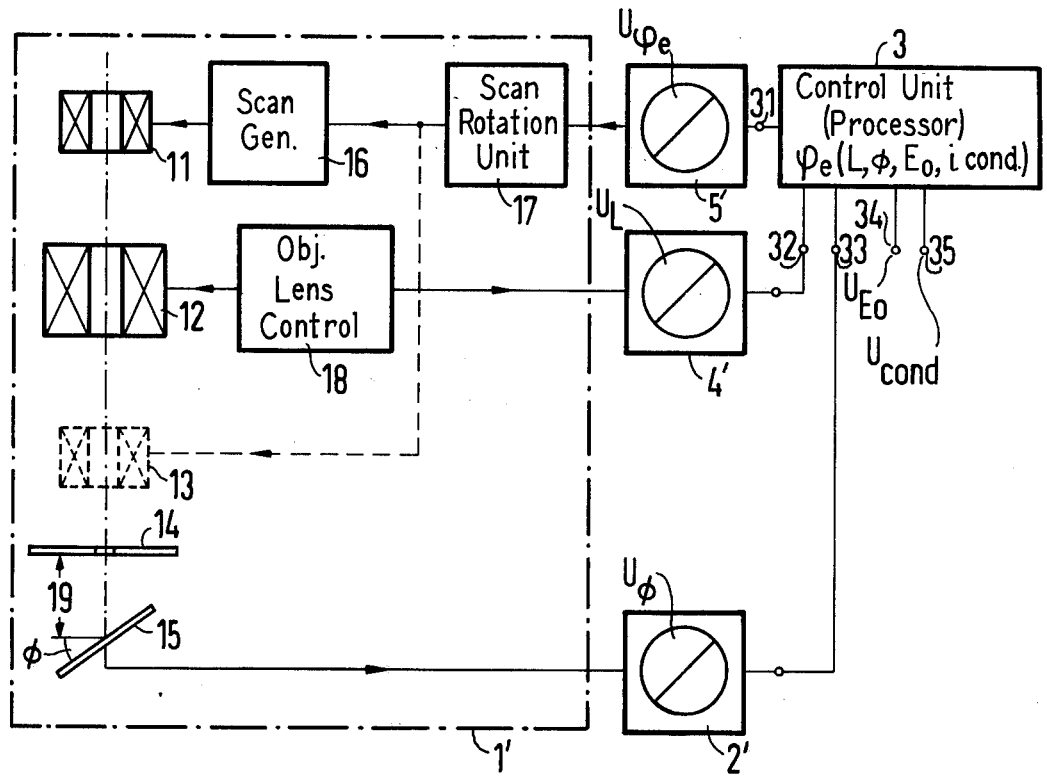
FIG. 9 is a functional block diagram of apparatus for effecting correcting rotation of the scanning raster in accordance with the present invention.

FIG. 9 shows a functional block diagram of an apparatus constructed in accordance with an illustrative embodiment of the present invention. The production of the scanning raster in the raster electron microscope 1' occurs by rectilinear deflection by means of transverse magnetic fields, produced by the deflection unit 11. An increase in the magnification of the image occurs as a result of a weakening of the current in the deflection coils, so that a smaller area of the specimen is scanned, with the visual image displayed by the picture tube (not shown) being unchanged.

The deflection of the beam in x and y directions normally occurs between two condenser lenses 12', one of which is shown in FIG. 9. The mounting of the deflection unit 11 above or below the condenser lens 12' leads to a reduction in raster rotation. A correction unit 13 can optionally be arranged beneath the condenser lens 12'. The correction unit 13 incorporates fixed deflection coils which are adapted to change the orientation of the scanning raster relative to the scanning axis.

The coils of the scan deflection unit 11 (or of the correctional unit 13) are controlled by a scan generator 16, which in turn is controlled by a scan rotation unit 17. The scan rotation unit 17 is connected to a control unit 3', which is preferably a microprocessor. The control unit 3' produces a control signal at a terminal 31, which is representative of a function of the working interval $d$ and of the inclination angle $\phi$. The control unit 3' receives, from terminals 32 and 33, signals containing information about the respective inclination angle $\phi$ of the specimen, and about the working distance L, and which are generated with the aid of the converters 2' and 4'.

A potentiometer or other transducer (not shown) is associated with the platform 15 on which the sample is supported, so that an analog signal is produced in response to the angle $\phi$ of inclination. The converter 2' converts the analog signal to a digital signal according to the requirements of the control unit 3'. A second analog signal, responsive to the magnitude of the working internal is derived from the objective lens control 18 and is connected to an analog to digital converter 4', which converts it to a digital signal according to the requirements of the control unit 3'. From these two digital signals, a digital representation of a control signal is automatically produced by the control unit 3', causing the scan rotation unit to rotate the raster so that the SEM-image is automatically corrected by the control signal, which is made available at the output of a digital to analog converter 5'. The control signal is derived from the inputs applied to the terminals 32 and 33 by an empirically determined function, which is arrived at for each design of electron microscope by simple experimentation. This function is permanently stored in the storage unit of a microprocessor or other data processing apparatus making up the control unit 3'. The function can comprise, for example, an $n$ dimensional table giving a control signal value for any combination of $n$ inputs. Conventional interpolation procedures can be used when the values of the independent variables fall between listings in the table. The particular organization of the microprocessor or other data processing device, and the program therefor, form no part of the present invention.

Figure 10:
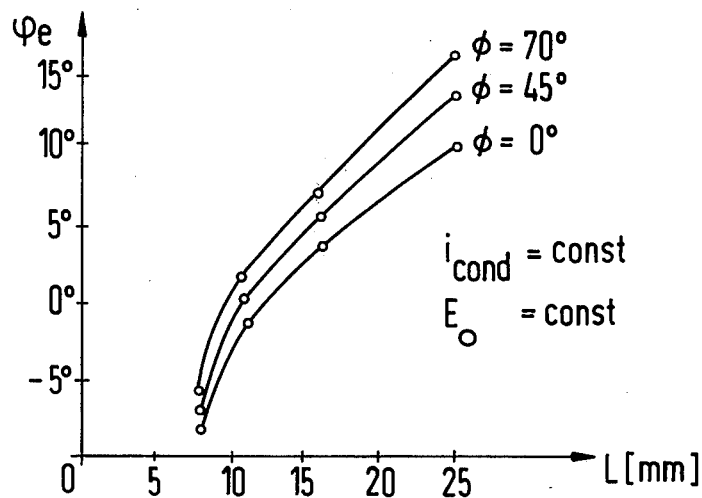
FIG. 10 is a series of graphs relating the calibration function $\phi e$ with the working distance L for different values of inclination, with the primary beam voltage and the condenser lens current both constant.

FIG. 10 shows calibration functions $\phi e$ as a function of the working interval $d$ and of the inclination angle $\phi$ of the specimen, for a given primary beam voltage and a given current flowing through the condenser lens. The control unit 3' automatically calculates, on the basis of these functions, the required control signal for each inclination angle $\phi$ and for each working distance L.

Preferably, the signals applied to the terminals 34 and 35 are also taken into consideration by the control device 3'. The signal applied to the terminal 34 is representative of the primary beam voltage, and the signal applied to the terminal 35 is representative of the condenser lens current. In practice these values are not often changed, but remain constant over long periods of time.

With the apparatus and method described, it is advantageously possible for the first time to produce clear, distortion-free SEM images fully automatically. Not only the reproduction of a genuine picture of the object is advantageously possible, in which right angles present on the surface of the specimen also appear as right angles in the image; but also it permits for the first time in general the trivial application of Cartesian or similar coordinates in the quantitative evaluation of raster electron microscopic images. The images of the raster electron microscope become largely errorless for the first time, as a result thereof.

In one embodiment of the apparatus of FIG. 9, the following components are used:
Converters 2' and 3': A/D Converter 7570 from Analog Devices
Control Unit 3': Motorola M 6800, Intel 8080, Fairchild F8, Rockwell PP58.
Scan-Generator 16: "Autoscan" ETEC Corp., Cal. USA
Scan-Rotation Unit 17: "Autoscan" ETEC Corp., Cal. USA
Objective lens Control 18: "Autoscan" ETEC Corp., Cal. USA In the use of the present invention, the most favorable angles of inclination is 60°–80°, due to the secondary electron yield and the yield of back-scattered electrons in this region.

In FIG. 9, the correcting coils 13 and the line connecting them to the scan rotation unit 17 are shown in dashed lines because the correcting coils 13 are optional, when the rotation of the raster by control of the scan generator 17 is adequate. Alternatively, the correction coils 13 may alone be used to effect the required rotation of the raster, or the unit 17 may control both the units 16 and 13 simultaneously.

What is claimed is:

1. A method for the production of undistorted images of an inclined specimen in scanning electron microscope comprising the steps of rotating said specimen about the axis of the scanning beam until the $x_2$-direction in which the beam is deflected is aligned with the $x_1$-direction of the specimen, rotating the scanning raster of said scanning beam in the same direction through an angle $\phi$ until the angle between the $x_2$ and the $x_1$ directions is equal to the angle between the $y_2$-direction of said beam and the $y_1$-direction of said specimen, said angle $\phi$ being calculated from the angle of inclination of said specimen and the distance between said specimen and said microscope, and rotating said specimen back until the $x_1$-direction becomes aligned with the $x_2$-direction and the $y_1$-direction becomes aligned with the $y_2$-direction.

2. A method for the production of undistorted images of an inclined specimen in a scanning electron microscope comprising the steps of rotating the scanning raster of the scanning beam through an angle calculated from the angle of inclination and the working distance between said specimen and said microscope, and rotating said specimen until the scanning line direction and the direction of advance of scanning become aligned with two generally orthogonal directions on the surface of said specimen.

3. The method according to claim 2, including the step of using a data processing unit for automatically effecting rotation of the scanning raster in response to signals representative of said angle of inclination and said working distance.

4. The method according to claim 3, including the step of supplying signals to said data processing unit which are responsive to the primary beam voltage and the current in the condenser lens of said electron microscope.

5. The method according to claim 2, including the step of mounting said specimen on a platform rotatable about the axis of said scanning beam.

6. Apparatus for the production of distortion-free SEM pictures including a scanning electron microscope having a deflection system and an electron lens, means for supporting a specimen at an angle inclined to a plane normal to the scanning beam, means for producing a first signal representative of the angle of inclination, means for producing a second signal representative of the working distance between said specimen and said microscope, a control unit connected to receive said first and second signals, said control unit producing a control signal in accordance with an empirical relationship between the representations of said first and second signals, a raster rotation unit connected with said control unit and responsive to said control signal, said raster rotation unit being connected with said deflection system for rotating the raster of said scanning beam in response to said control signal.

7. Apparatus according to claim 6, wherein said deflection system includes a plurality of correction coils juxtaposed with said scanning beam, said correction coils being connected to said scan rotation unit and operative to rotate said electron beam in response to said control signal.

8. Apparatus according to claim 6, wherein said control unit produces said control signal in accordance with an empirical relationship which includes the primary beam voltage and condenser lens current of said microscope as independent variables.

9. Apparatus according to claim 6, in which said control unit comprises a microprocessor.

10. Apparatus according to claim 6, wherein said means for producing said first and second signals both comprise analog-to-digital converters.

* * * * *